(12) United States Patent
Wert

(10) Patent No.: US 6,894,537 B1
(45) Date of Patent: May 17, 2005

(54) APPARATUS AND METHOD FOR LEVEL SHIFTING IN POWER-ON RESET CIRCUITRY IN DUAL POWER SUPPLY DOMAINS

(75) Inventor: Joseph D. Wert, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 3 days.

(21) Appl. No.: 10/322,983

(22) Filed: Dec. 18, 2002

(51) Int. Cl.[7] .......................................... H03K 19/0185
(52) U.S. Cl. ............................ 326/63; 326/68; 326/81
(58) Field of Search ............................. 326/63, 68–71, 326/80, 81, 83

(56) References Cited

U.S. PATENT DOCUMENTS 5,534,801 A  * 7/1996 Wu et al. ...................... 327/72
5,654,664 A  * 8/1997 Park et al. ................... 327/531
6,023,175 A  * 2/2000 Nunomiya et al. ........... 326/68
6,087,852 A  * 7/2000 Briggs et al. ................. 326/68
6,335,637 B1   1/2002 Correale, Jr. et al.
6,570,401 B2   5/2003 Correale, Jr. et al.
6,674,304 B1 * 1/2004 Matthews .................... 326/80
6,724,222 B2 * 4/2004 Patel et al. .................. 326/80
6,753,697 B2   6/2004 Nakase \* cited by examiner

*Primary Examiner*—Don Le

(57) ABSTRACT

A level shifter for use in a dual power supply circuit operating from a VDD power supply and a VDDH power supply greater than the VDD power supply. The level shifter indicates to a status circuit in the VDDH power supply domain that the VDD power supply is enabled. The level shifter detects when the VDD power supply is on and sets an enable signal to the status circuit. The level shifter also detects when the VDD power supply is off and clears the enable signal to the status circuit.

20 Claims, 2 Drawing Sheets

US 6,894,537 B1

APPARATUS AND METHOD FOR LEVEL SHIFTING IN POWER-ON RESET CIRCUITRY IN DUAL POWER SUPPLY DOMAINS

TECHNICAL FIELD OF THE INVENTION

The present invention is generally directed to large scale integrated circuits and, in particular, to power-on reset circuits for use in integrated circuits having dual power supply domains.

BACKGROUND OF THE INVENTION

In recent years, there have been great advancements in the speed, power, and complexity of integrated circuits, such as application specific integrated circuit (ASIC) chips, random access memory (RAM) chips, microprocessor (uP) chips, and the like. These advancements have made possible the development of system-on-a-chip (SOC) devices. A SOC device integrates into a single chip all (or nearly all) of the components of a complex electronic system, such as a wireless receiver (i.e., cell phone, a television receiver, and the like). SOC devices greatly reduce the size, cost, and power consumption of the overall system.

Reductions in power consumption are particularly important in SOC devices. SOC devices are frequently used in portable devices that operate on battery power. Since maximizing battery life is a critical design objective in a portable device, it is essential to minimize the power consumption of SOC devices that may be used in the portable device. Furthermore, even if an SOC device is not used in a portable device, minimizing power consumption is still an important objective. The increased use of a wide variety of electronic products by consumers and businesses has caused corresponding increases in the electrical utility bills of homeowners and business operators. The increased use of electronic products also is a major contributor to the increased electrical demand that has caused highly publicized power shortages in the United States, particularly California.

To minimize power consumption in electronic devices, particularly SOC devices, many manufacturers have reduced the voltage levels at which electronic components operate. Low power integrated circuit (IC) technology operating at +3.3 volts replaced IC technology operating at +5.0 volts. The +3.3 volt IC technology was, in turn, replaced by +1.8 volt IC technology in many applications, particularly microprocessor and memory applications.

However, as the operating voltage of an integrated circuit is reduced, the noise margins of the integrated circuit are also reduced. Thus, an integrated circuit operating at +1.8 volts has smaller noise margins than a circuit operating at +3.3 volts. In deep submicron VLSI designs, two voltage sources for a chip design are common. One voltage source is an internal core power supply voltage (i.e., VDD) that has a lower swing voltage than the second voltage source, which provides the input/output (I/O) S pad ring voltage (i.e., VDDH). Common range values may include a VDD of 1–1.8 volts and a VDDH range of 2.3–3.6 volts.

Many processing systems implement states in which the output power supply, VDDH, is powered up while the internal core power supply, VDD, is zero. In order to allow circuits in the VDDH power supply domain to know the status of the VDD power supply domain, a power status signal in the VDD power supply domain is level shifted and latched into the higher VDDH power supply domain. The power status signal is a power-on reset (POR) signal that is detected and latched by the level shifting circuit. The POR signal indicates that the VDD power supply is ON.

Unfortunately, however, in many systems, if the VDD power supply is cycled ON and OFF several times, the latching circuit in the level shifter is not cleared. Thus, if the VDD power supply is turned OFF, the level shifter will falsely indicate that the VDD power supply is present. Some conventional level shifting circuits that clear the VDD status signal each time that VDD is turned OFF consume an excessive amount of current.

FIG. 4 illustrates conventional level shifter 400 according to one embodiment of the prior art. Level shifter 400 comprises N-channel transistors 402, 404, 405, 406 and 408, P-channel transistors 412–418, and capacitor 420. Level shifter 400 operates between VDDH=+3.3 volts and VSS= ground. The inputs to level shifter 400 are the VDD power supply and the IN signal. Level shifter generates the POWER VALID signal on the OUT node.

The IN signal indicates that the VDD power supply is enabled. When VDD goes high, the IN signal goes high shortly thereafter. When VDD goes low, the IN signal goes low shortly thereafter.

P-channel transistor 414 and N-channel transistor 404 form a first inverter stage. P-channel transistor 415 and N-channel transistor 406 form a second inverter stage. Finally, P-channel transistors 416, 417, and 418 and N-channel transistor 408 form a third inverter stage.

When the VDD power supply is on, VDD is a Logic 1 (+1.8 volts) and the IN signal also is a Logic 1 (+1.8 volts). When the IN signal goes to Logic 1, N-channel transistor 402 is on and the INT1* node is pulled down to ground (i.e., Logic 0). This turns on P-channel transistor 413. When the IN signal is Logic 1, N-channel transistor 404 is on and P-channel transistor 414 is off. This pulls the gate of N-channel transistor 405 to ground, thereby turning off N-channel transistor 405. Since P-channel transistor 413 is on and N-channel transistor 405 is off, the INT1 node is pulled up to the VDDH power supply rail. This ensures that P-channel transistor 412 is turned off. Thus the input stage latches the INT1 node to a Logic 1 level equal to VDDH and latches the INT1* node to Logic 0.

Since INT1 is VDDH, capacitor 420 charges up to VDDH. This turns on N-channel transistor 406 and turns off P-channel transistor 415, so that the INT2 node is pulled low (i.e., Logic 0). The Logic 0 on INT2 node turns on P-channel transistors 416, 417 and 418 and turns off N-channel transistor 408. This drives the OUT node high, so that POWER VALID is Logic 1.

At some point, the VDD power supply may turn off, so that the VDD power supply rail at the source of P-channel transistor 414 goes to Logic 0 (i.e., ground). The IN signal goes to Logic 0 a fraction of a second after VDD turns off. Unfortunately, the Logic 0 value of the IN signal does not propagate through the first inverter formed by P-channel transistor 414 and N-channel transistor 404. This is because the VDD power supply rail provides power to the first inverter, and VDD has turned off.

As a result, when the IN signal goes to Logic 0, the gate of N-channel transistor 405 does not go to Logic 1. Since N-channel transistor 405 is stuck in the off position, the INT1 node is stuck at Logic 1. Therefore, if the VDD power supply is cycled on and off, the INT1 node in the latching circuit in level shifter 400 is not cleared and the OUT signal is stuck at Logic 1. Thus, if the VDD power supply is turned off, level shifter 400 falsely indicates that the VDD power supply is still present.

Therefore, there is a need in the art for integrated circuits in which one power supply domain be powered up while internal core circuitry is not powered up. More particularly, there is a need for an improved level shifter circuit that indicates the presence of a valid VDD power supply to a higher VDDH power supply domain that clears itself whenever the VDD power supply signal is turned OFF.

SUMMARY OF THE INVENTION

To address the above-discussed deficiencies of the prior art, it is a primary object of the present invention to provide a level shifter for use in a dual power supply circuit operating from a VDD power supply and a VDDH power supply greater than the VDD power supply. According to an advantageous embodiment of the present invention, the level shifter is capable of indicating to a status circuit in the VDDH power supply domain that the VDD power supply is enabled, wherein the level shifter detects when the VDD power supply is on and sets an enable signal to the status circuit and wherein the level shifter detects when the VDD power supply is off and clears the enable signal to the status circuit.

According to one embodiment of the present invention, the level shifter receives the VDD power supply voltage and a VDD status signal, wherein the VDD status signal indicates that the VDD power supply voltage is present.

According to another embodiment of the present invention, the level shifter clears the enable signal to the status circuit if either the VDD power supply voltage is off or the VDD status signal indicates that the VDD power supply voltage is not present.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain is words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 4, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged integrated circuit.

Figure 1:
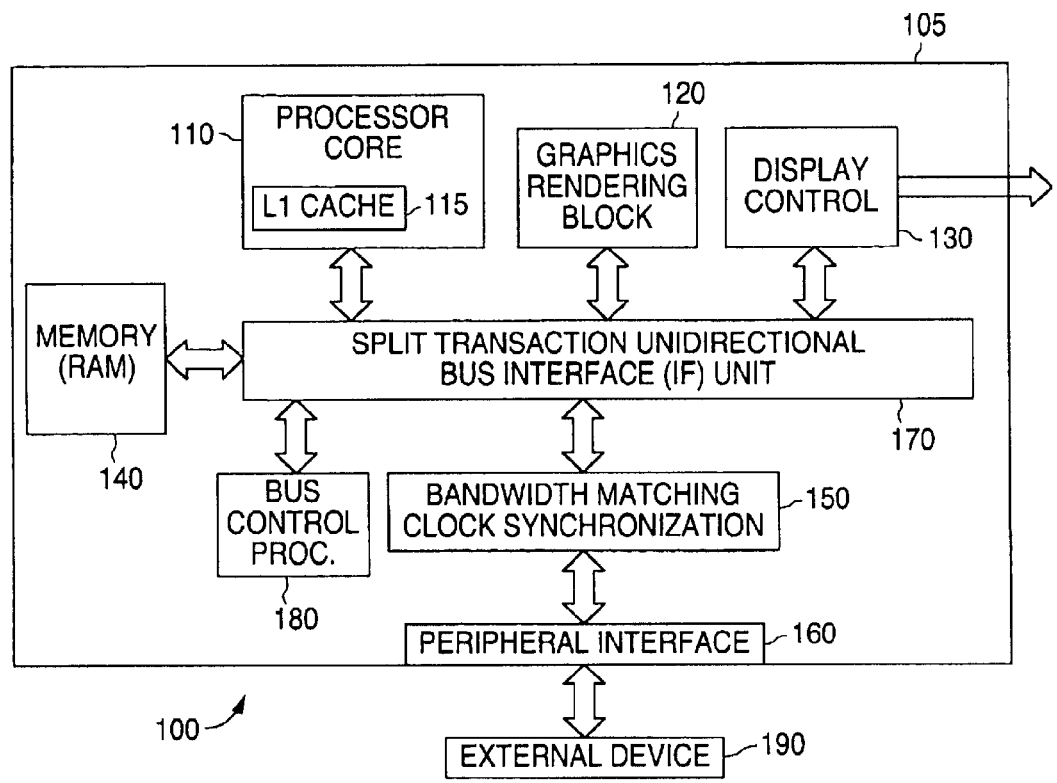
FIG. 1 illustrates a processing system which comprises an exemplary system-on-a-chip (SOC) device according to one embodiment of the present invention.

FIG. 1 illustrates processing system 100, which comprises exemplary system-on-a-chip (SOC) device 105 according to one embodiment of the present invention. SOC device 105 is a single integrated circuit comprising processor core 110, graphics rendering block 120, (optional) display control circuit 130, memory 140, bandwidth matching-clock synchronization interface 150, peripheral interface 160, split transaction, unidirectional bus interface (IF) unit 170 (or bus IF unit 170), and bus control processor 180. Processor core 110 contains internal level one (L1) cache 115. Peripheral interface 160 communicates with external device 190.

Processing system 100 is shown in a general level of detail because it is intended to represent any one of a wide variety of electronic products, particularly consumer appliances. Display controller 130 is described above as optional because not all end-products require the use of a display. Likewise, graphics rendering block 120 may also be optional.

For example, processing system 100 may be a printer rendering system for use in a conventional laser printer. Processing system 100 also may represent selected portions of the video and audio compression-decompression circuitry of a video playback system, such as a video cassette recorder or a digital versatile disk (DVD) player. In another alternative embodiment, processing system 100 may comprise selected portions of a cable television set-top box or a stereo receiver.

Bus. IF unit 170 provides high-speed, low latency communication paths between the components coupled to bus IF unit 170. Each component coupled to bus IF unit 170 is capable of initiating or servicing data requests via four unidirectional bus interfaces: two request buses and a two data buses. The request bus contains address lines, byte enable lines (32-bit or 64-bit data reads), cycle type lines, and routing information for transactions. The data bus contains data lines, byte enable lines (for data writes), completion status lines, and routing information to associate the data bus packets with the appropriate request bus packet. As noted, the four buses are unidirectional and point-to-point to minimize loading and timing variations. In addition, bus IF unit 170 provides a diagnostic bus, power management controls, clocks, reset signals, and a scan interface.

Bus IF unit 170 implements a transaction protocol that defines the mechanism for transferring packets between devices coupled to bus IF unit 170. In addition, the transaction protocol defines the control for clocks and power management. The packet protocol standardizes the system level interactions between devices coupled to bus IF unit 170. The hardware requirements for mapping transactions, arbitrating packets, and maintaining coherency is specified in the packet protocol.

Bandwidth matching-clock synchronization interface 150 comprise a queue that bridges ports on bus IF unit 170 that have different widths or different frequencies, or both. Bus control processor 180 controls certain operations of bus IF unit 170 related to clock timing, power management, and diagnostic features. Peripheral interface 160 is a bus device used for chip-to-chip combination between SOC device 105 and an external peripheral device, such as external device 190.

In an advantageous embodiment of the present invention, SOC device 105 may use two power supplies: an internal low voltage supply (e.g., VDD=+1.8 volts) to power internal logic and an input/output (I/O) high voltage supply (e.g., VDDH=+3.3 volts) to power I/O lines that interface with external circuitry. For example, processor core 110 and bus IF unit 170 may operate at VDD=+1.8 volts and the output stage of peripheral interface 160 may operate at VDDH=+3.3 volts. Additionally, +3.3 volt circuitry may be used within SOC device 105 to drive selected internal address and data lines. For example, if memory (i.e., RAM) 140 is large and separated from bus IF unit 170, the address and data lines of memory 140 may be driven by +3.3V power supply rails.

The present invention provides a level shifting circuit capable of transferring a power status signal from the VDD power domain to the higher VDDH power supply domain. The power status signal is a power-on reset (POR) signal that is detected and latched by a level shifting circuit. The POR signal indicates that the VDD power supply is ON. The latching circuit translates the POR signal to the higher voltage domain. If the VDD power supply is cycled ON and OFF several times, the latching circuit according to the principles of the present invention is cleared each time that VDD is turned OFF.

Figure 2:
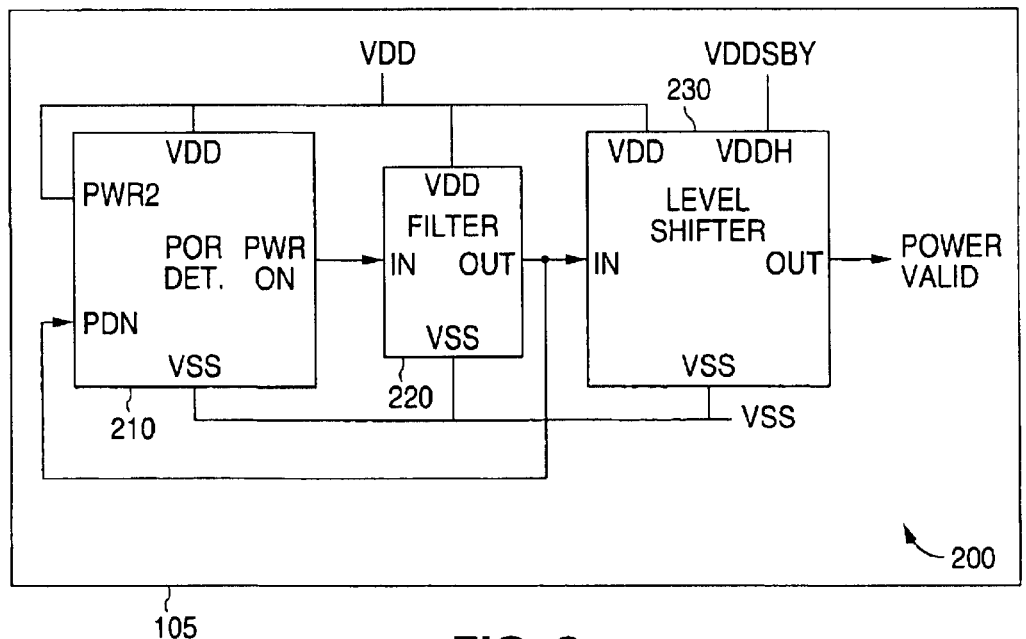
FIG. 2 illustrates power-on reset (POR) status circuitry according to one embodiment of the present invention.

FIG. 2 illustrates power-on reset (POR) status circuitry 200 according to one embodiment of the present invention. POR status circuit 200 comprises power-on reset (POR) detector 210, filter 220 and level shifter 230. POR detector 210 may be any conventional circuit that detects with the PWR2 input (i.e., VDD) is set high and output a high voltage (i.e., +1.8 volt) on the PWR ON output. Filter 220 prevents "glitches" caused by noise spikes in the PWR ON output from reaching level shifter 230. Thus, a stable Logic 1 is issued to level shifter 230, which responds by setting the POWER VALID signal to a Logic 1 in the VDDH=+3.3 volt power supply domain.

Figure 3:
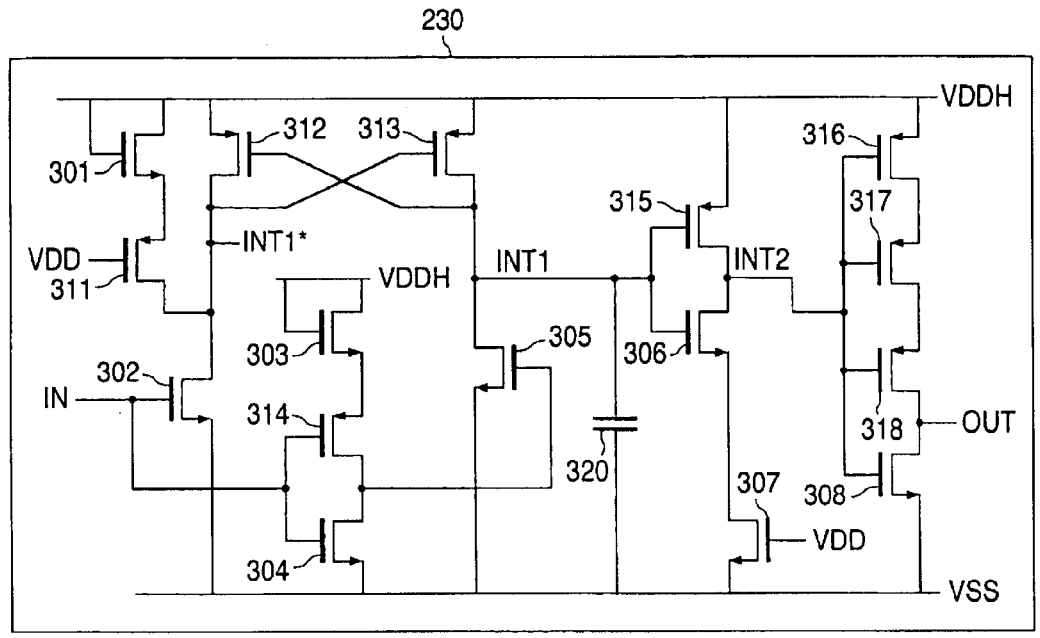
FIG. 3 illustrates an exemplary level shifter according to an advantageous embodiment of the present invention.
Figure 4:
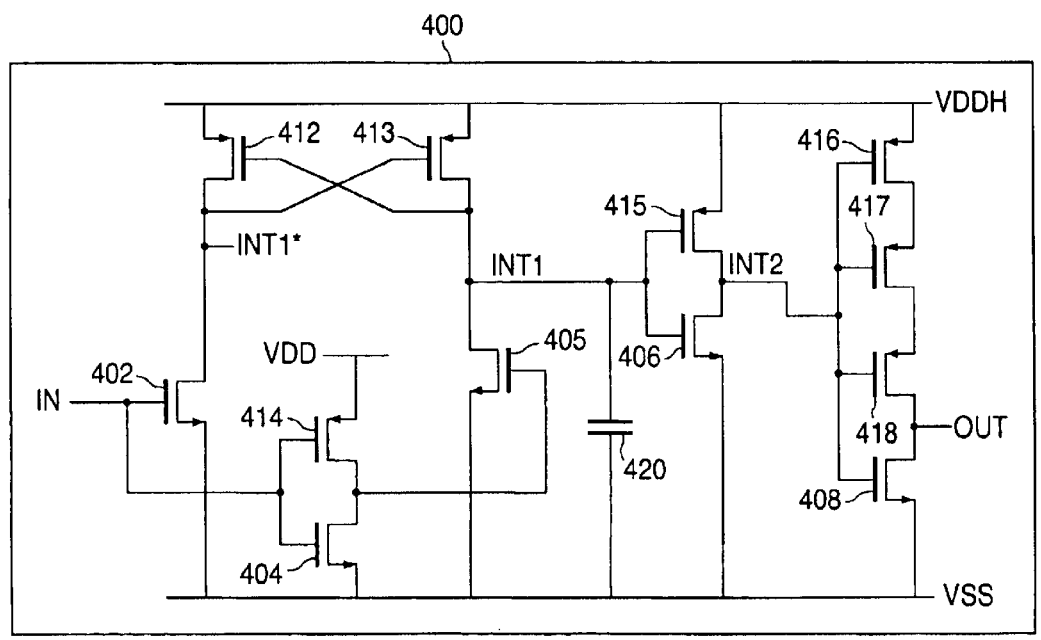
FIG. 4 illustrates a conventional level shifter according to one embodiment of the prior art.

FIG. 3 illustrates exemplary level shifter 230 according to an advantageous embodiment of the present invention. Level shifter 230 comprises N-channel transistors 301–308, P-channel transistors 311–318, and capacitor 320. Level shifter 230 operates between VDDH=+3.3 volts and VSS=ground. The inputs to level shifter 230 are the VDD power supply and the IN signal, which is coupled to the OUT signal from filter 220. Level shifter generates the POWER VALID signal on the OUT node.

The gate and the drain of N-channel transistor 301 and the gate and the drain of N-channel transistor 303 are connected to the VDDH power supply rail. In this configuration, N-channel transistors 301 and 303 cause threshold voltage drops between the VDDH power supply rail and the sources of P-channel transistors 311 and 314, respectively. The threshold voltage drops ensure that P-channel transistors 311 and 314 turn completely off and have leakage currents that are nearly zero.

P-channel transistor 314 and N-channel transistor 304 form a first inverter stage. P-channel transistor 315 and N-channel transistor 306 form a second inverter stage. Finally, P-channel transistors 316, 317, and 318 and N-channel transistor 308 form a s third inverter stage.

When the VDD power supply is ON, VDD is a Logic 1 (+1.8 volts) and the IN signal also is a Logic 1 (+1.8 volts). VDD equal to Logic 1 turns on N-channel transistor 307 and turns off P-channel transistor 311. When the IN signal goes to Logic 1, N10 channel transistor 302 is on and the INT1* node is pulled down to ground (i.e., Logic 0). This turns on P-channel transistor 313.

When the IN signal is Logic 1, N-channel transistor 304 is on and P-channel transistor 314 is off. This pulls the gate of N-channel transistor 305 to ground, thereby turning off N-channel is transistor 305. Since P-channel transistor 313 is on and N-channel transistor 305 is off, the INT1 node is pulled up to the VDDH power supply rail. This ensures that P-channel transistor 312 is turned off. Thus the input stage latches the INT1 node to a Logic 1 level equal to VDDH and latches the INT1* node to Logic 0.

Since INT1 is VDDH, capacitor 320 charges up to VDDH. This turns on N-channel transistor 306 and turns off P-channel transistor 315, so that the INT2 node is pulled low (i.e., Logic 0) through N-channel transistor 307. The Logic 0 on INT2 node turns on P-channel transistors 316, 317 and 318 and turns off N-channel transistor 308. This drives the OUT node high, so that POWER VALID is Logic 1.

The IN signal goes to Logic 0 whenever VDD goes to Logic 0 (i.e., ground) in that the high value of the IN signal is set by VDD. The IN signal goes high (i.e., to the value of VDD at that time) when a sampling circuit sampling VDD indicates that VDD is high enough to be considered valid.

At some point, the VDD power supply may go low, so that the IN signal goes to Logic 0 (i.e., ground) and the VDD input goes to Logic 0 (i.e., ground). VDD equal to Logic 0 turns off N-channel transistor 307 and turns on P-channel transistor 311. When the IN signal goes to Logic 0, N-channel transistor 302 is off and the INT1* node is pulled high by N-channel transistor 301 and P-channel transistor 311. This turns off P-channel transistor 313. When the IN signal is Logic 1, N-channel transistor 304 is off and P-channel transistor 314 is on. This pulls the gate of N-channel transistor 305 up to Logic 1, thereby turning on N-channel transistor 305. Since P-channel transistor 313 is off and N-channel transistor 305 is on, the INT1 node is pulled down to the VSS power supply rail (i.e., ground). This discharges capacitor 320 through N-channel transistor 305. This turns on P-channel transistor 312, which pulls the INT1* node up to the VDDH power supply rail. Thus, the input stage latches the INT1 node to a Logic 0 level and latches the INT1* node to Logic 1.

Since INT1 is pulled down to ground, N-channel transistor 306 is off and P-channel transistor 315 is on. This pulls the INT2 node up to the VDDH power supply rail (i.e., Logic 1). The Logic 1 on the INT2 node turns off P-channel transistors 316, 317 and 318 and turns on N-channel transistor 308. This drives the OUT node low, so that POWER VALID is Logic 0.

Although the present invention has been described with an exemplary embodiment, various changes and modifications may be suggested to one skilled in the art. It is intended that the present invention encompass such changes and modifications as fall within the scope of the appended claims.

What is claimed is:

1. For use in a dual power supply circuit operating from a VDD power supply and a VDDH power supply greater than said VDD power supply, a level shifter capable of indicating to a status circuit in the VDDH power supply domain that the VDD power supply is enabled, wherein said level shifter detects when the VDD power supply is on and sets an enable signal to the status circuit and wherein said level shifter detects when the VDD power supply is off and clears said enable signal to the status circuit.

2. The level shifter as set forth in claim 1 wherein said level shifter receives the VDD power supply voltage and a VDD status signal, wherein said VDD status signal indicates that the VDD power supply voltage is present.

3. The level shifter as set forth in claim 1 wherein said level shifter clears said enable signal to the status circuit if either the VDD power supply voltage is off or the VDD status signal indicates that the VDD power supply voltage is not present.

4. The level shifter as set forth in claim 2 wherein said VDD status signal is a power-on reset (POR) signal from a power-on reset (POR) detector.

5. The level shifter as set forth in claim 1 wherein said level shifter comprises eight P channel transistors, eight N channel transistors, and a capacitor.

6. For use in a dual power supply circuit operating form a VDD power supply and a VDDH power supply greater than said VDD power supply, a level shifter comprising:
   a first inverter stage comprising a first P channel tranistor and a first N channel transistor wherein an input of said first inverter stage is coupled to a VDD status signal, and wherein a source of said first N channel transistor is coupled to ground;
   a second N channel transistor having a gate coupled to an output of said first inverter stage and having a source coupled to ground;
   a second inverter stage comprising a second P channel transistor and a third N channel transistor wherein an input of said second inverter stage is coupled to a drain of said second N channel transistor;
   a third P channel transistor having a source coupled to said VDDH power supply and having a drain coupled a drain of said second N channel transistor;
   a fourth N channel transistor having a gate coupled to a VDD power supply, and having a source coupled to ground;
   wherein a source of said third N channel transistor is coupled to a drain of said fourth N channel transistor; and
   a capacitor coupled between said input of said second inverter stage and ground.

7. The level shifter as set forth in claim 6 further comprising:
   a fifth N channel transistor having a gate coupled to said VDD status signal, wherein a source of said fifth N channel transistor is coupled to ground; and
   a fourth P channel transistor having a drain coupled to a drain of said fifth N channel transistor and having a source coupled to said VDDH power supply, and a gate coupled to said drain of said third P channel transistor, and wherein a gate of said third P channel transistor is coupled to said drain of said fourth P channel transistor.

8. The level shifter as set forth in claim 7 further comprising:
   a sixth N channel transistor having a gate and a drain coupled to said VDDH power supply and having a source coupled to a source of said first P channel transistor of said first inverter stage.

9. The level shifter as set forth in claim 8 further comprising:
   a fifth P channel transistor having a gate coupled to said VDD power supply, and having a drain coupled to a drain of said fifth N channel transistor; and
   a seventh N channel transistor have a gate and a drain coupled to said VDDH power supply, and having a source coupled to a source of said fifth P channel transistor.

10. The level shifter as set forth in claim 9 further comprising:
    a third inverter stage comprising a sixth P channel transistor, a seventh P channel transistor, an eighth P channel transistor, and an eighth N channel transistor wherein an input of said third inverter stage is coupled to an output of said second inverter stage; and
    wherein a source ofsaid sixth P channel transistor is coupled to said VDDH power supply, and a drain of said sixth P channel transistor is coupled to a source of said seventh P channel transistor, and a drain of said seventh P channel transistor is coupled to a source of said eighth P channel transistor, and wherein a drain of said eighth P channel transistor is coupled to a drain of siad eighth N channel transistor, and wherein a source of said eighth N channel transistor is coupled to ground.

11. The level shifter as set forth in claim 10 wherein a power valid signal is output from said third inverter stage at a node located between a drain of said eighth P channel transistor and a drain of said eighth N channel transistor.

12. For use in a dual power supply circuit operating form a VDD power supply and a VDDH power supply greater than said VDD power supply, a power-on reset (POR) status circuit comprising:
    a power-on reset (POR) detector; and
    a level shifter having an input coupled to an output of said power-on reset (POR) detector, said level shifter capable of indicating to a status circuit that a VDD power supply is enbabled, wherein said level shifter detects when the VDD power supply is on and set an enable signal to the status circuit in said VDDH power supply domain and wherein said level shifter detects when the VDD power supply is off and clears said enable signal to the status circuit.

13. The power-on reset (POR) status circuit as set forth in claim 12 wherein said level shifter receives the VDD power supply voltage and a VDD status signal, wherein said VDD status signal indicates that the VDD power supply voltage is present.

14. The power-on reset (POR) status circuit as set forth in claim 12 wherein said level shifter clears said enable signal to the status circuit if either the VDD power supply voltage is off or the VDD status signal indicates that the VDD power supply voltage is not present.

15. The power-on reset (POR) status circuit as set forth in claim 12 wherein said level shifter comprises eight P channel transistors, eight N channel transistors, and a capcitor.

16. The power-on reset (POR) status circuit as set forth in claim 12 wherein said level shifter comprises:

a first inverter stage comprising a first P channel transistor and a first N channel transistor wherein an input of said first inverter stage is coupled to a VDD status signal, and wherein a source of said first N channel transistor is coupled to ground;

a second N channel transistor having a gate coupled to an output of said first inverter stage and having a source coupled to ground;

a second inverter stage comprising a second P channel transistor and a third N channel transistor wherein an input of said second inverter stage is coupled to a drain of said second N channel transistor;

a third P channel transistor having a source coupled to said VDDH power suply and having a drain coupled a drain of said second N channel transistor;

a fourth N channel transistor having a gate coupled to a VDD power supply, and having a source coupled to ground;

wherein a source of said third N channel transistor is coupled to a drain of said fourth N channel transistor; and a capacitor coupled between said input of said second inverter stage and ground.

17. The power-on reset (POR) status circuit as set forth in claim 16 wherein said level shifter further comprises:

a fifth N channel transistor having a gate coupled to said VDD status signal, wherein a source of said fifth N channel transistor is coupled to ground; and a fourth P channel transistor having a drain coupled to a drain of said fifth N channel transistor and having a source coupled to said VDDH power supply, and a gate coupled to said drain of said third P channel transistor, and wherein a gate of said third P channel transistor is coupled to said drain of said fourth P channel transistor.

18. The power-on reset (POR) status circuit as set forth in claim 17 wherein said level shifter further comprises:

a sixth N channel transistor having a gate and a drain coupled to said VDDH power supply and having a source coupled to a source of said first P channel transistor of said inverter stage.

19. The power-on reset (POR) status circuit as set forth in claim 18 wherein said level shifter further comprises:

a fifth P channel transistor having a gate coupled to said VDD power supply, and having a drain coupled to drain of said fifth N channel transistor; and a seventh N channel transistor have a gate and a drain coupled to said VDDH power supply, and having a source coupled to a source of said fifth P channel transistor.

20. The power-on reset (POR) status circuit as set forth in claim 19 wherein said level shifter further comprises:

a third inverter stage comprising a sixth P channel transistor, a seventh P channel transistor, an eighth P channel transistor, and an eighth N channel transistor wherein an input of said third inverter stage is coupled to an output of said second inverter stage;

wherein a source of said sixth P channel transisitor is coupled to said VDDH power supply, and a drain of said sixth P channel transistor is coupled to a source of said seventh P channel transistor, and a drain of said seventh P channel transistor is coupled to a source of said eighth P channel transistor, and wherein a drain of said eighth P channel transistor is coupled to a drain of said eighth N channel transistor, and wherein a source of said eighth N channel is coupled to ground; and wherein a power a valid signal is output from said third inverter stage at a node located between a drain ofsaid eighth P channel transistor and a drain of said N channel transistor.

* * * * *

UNITED STATES PATENT AND TRADEMARK OFFICE
CERTIFICATE OF CORRECTION

PATENT NO. : 6,894,537 B1
DATED : May 17, 2005
INVENTOR(S) : Joseph D. Wert

It is certified that error appears in the above-identified patent and that said Letters Patent is hereby corrected as shown below:

Column 1,
Line 57, delete "S" before "pad";

Column 6,
Line 19, delete "10" before "channel";

Column 8,
Line 27, delete "ofsaid" and replace with -- of said --;
Line 50, delete "set" and replace with -- sets --;

Column 10,
Line 6, insert -- first -- before "inverter";
Line 35, insert -- eighth -- before "N channel".

Signed and Sealed this

Twenty-first Day of February, 2006

JON W. DUDAS
*Director of the United States Patent and Trademark Office*